United States Patent [19]
Grimard et al.

[11] Patent Number: 5,605,603
[45] Date of Patent: Feb. 25, 1997

[54] DEEP TRENCH PROCESS

[75] Inventors: Dennis S. Grimard, Williston; Neal P. Marmillion, Colchester, both of Vt.

[73] Assignee: International Business Machines Corporation, Armonk, N.Y.

[21] Appl. No.: 412,666

[22] Filed: Mar. 29, 1995

[51] Int. Cl.$^6$ .................................................. H01L 21/302
[52] U.S. Cl. ........................... 156/662.1; 156/646.1; 156/643.1
[58] Field of Search ............................ 156/662.1, 643.1, 156/646.1; 216/99, 79

[56] References Cited

U.S. PATENT DOCUMENTS

| | | | |
|---|---|---|---|
| 4,384,918 | 5/1983 | Abe | 156/643 |
| 4,414,057 | 11/1983 | Bourassa et al. | 156/643 |
| 4,717,448 | 1/1988 | Cox | 156/643 |
| 4,771,730 | 9/1988 | Tezuka | 118/723 |
| 4,886,565 | 12/1989 | Koshiba et al. | 156/345 |
| 4,983,253 | 1/1991 | Wolfe et al. | 156/643 |
| 5,155,652 | 10/1992 | Logan et al. | 361/234 |
| 5,191,506 | 3/1993 | Logan et al. | 361/234 |
| 5,255,153 | 10/1993 | Nozawa et al. | 361/234 |
| 5,350,479 | 9/1994 | Collins et al. | 156/345 |
| 5,378,311 | 1/1995 | Nagayama et al. | 156/626 S |
| 5,423,941 | 6/1995 | Komura et al. | 156/643 |
| 5,470,782 | 11/1995 | Schwalke et al. | 437/67 |

FOREIGN PATENT DOCUMENTS 0489407  6/1992  European Pat. Off. .

OTHER PUBLICATIONS

"High Aspect Ratio Trench Etching", Bondur et al.; Proc SPIE—Int. Soc. Opt. Eng (1993); 1803 (Advanced Techniques for Integrated Circuit Processing II); Abstract Only.
Lii and Ng "Method for Magnetic Enhanced Reactive Ion Etch of Uniform Trench . . . " Research Disclosure 346, (1993).
Schwartz and Schaible "Reactive ion etching of silicon" J. Vac. Sci. Tech. 16, 410–413 (1979).
Bennett et al. "Silicon Trench Etching Using A Mixture Of A Fluorocarbon . . . " IBM Tech. Disc. Bull, 30, 337–338 (1988).

Primary Examiner—R. Bruce Breneman
Assistant Examiner—George Goudreau
Attorney, Agent, or Firm—Heslin & Rothenberg, P.C.

[57] ABSTRACT

A high yield process for creating uniform deep trenches in a crystalline silicon substrate is disclosed. The process involves immobilizing a crystalline silicon substrate on an electrostatic chuck in a plasma etching apparatus, heating the silicon substrate by raising the cathode temperature to 30° to 80° C., exposing the silicon substrate to a plasma generated from HBr, NF$_3$, and O$_2$; and carrying out a plasma etch with the temperature of the cathode held at 30° to 80° C.

7 Claims, 5 Drawing Sheets

DEEP TRENCH PROCESS

FIELD OF THE INVENTION

The invention relates to a process for creating highly uniform, deep trenches in a crystalline silicon substrate.

BACKGROUND OF THE INVENTION

In the formation of integrated circuits, it is often necessary to etch an aperture in a silicon substrate. In particular, the trend toward packing more memory cells into a given chip area has led to the development of trench memory cells, which require deep, narrow apertures. In these cells the charge plate of the storage capacitor is formed by one or more polysilicon layers and one or more dielectric layers that are coated within a deep (8 to 12 micron) trench. The sidewalls of these deep trenches must be substantially parallel, having, if anything, a slight, positive taper such that the angle between the trench wall and the surface is between 88° and 89.5° to maximize cell retention. However, the taper can be varied between 84 and 89.5 to improve trench fill characteristics. Moreover, the trench walls must be as uniform as possible and the bottom of the trench should be as close to hemispherical as possible.

U.S. Pat. No. 4,717,448 (Cox et al.) discloses a process for forming deep trenches in a silicon substrate by reactive ion etching through a silicon oxide mask in a plasma formed from HCl, $O_2$, and $BCl_3$. Other RIE chemistries are known, although few have been applied to the problem of creating deep trenches.

Common problems encountered in creating deep trenches are (1) mask erosion; (2) "raking"; (3) bowing of the walls; (4) sloping walls; and (5) "dovetails" at the bottom of the trench. These various defects are illustrated in FIGS. 1 and 2 and are discussed below.

Figure 1:
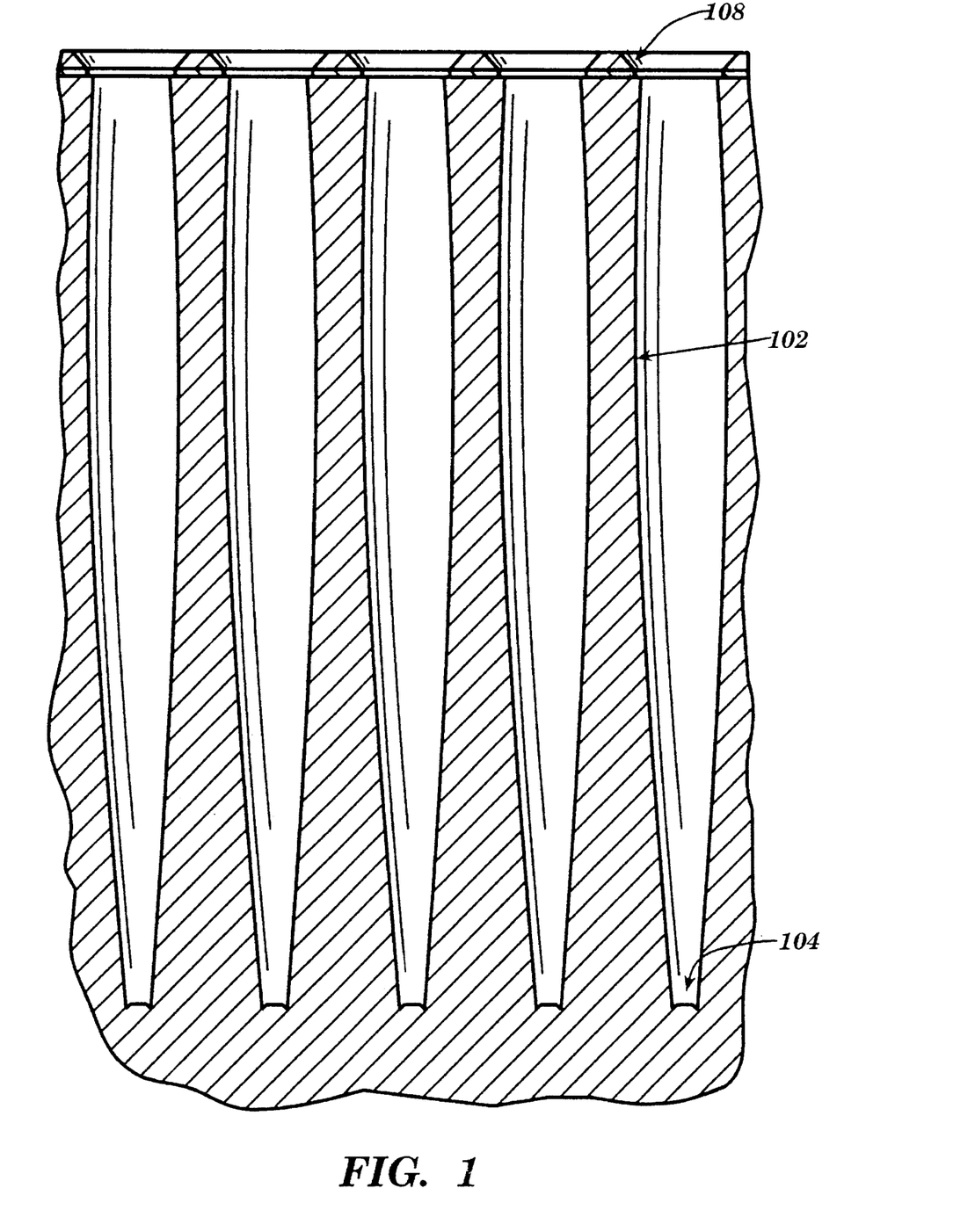
FIGS. 1 and 2 are cross sections of a silicon substrate illustrating various problems observed in prior art processes.
Figure 2:
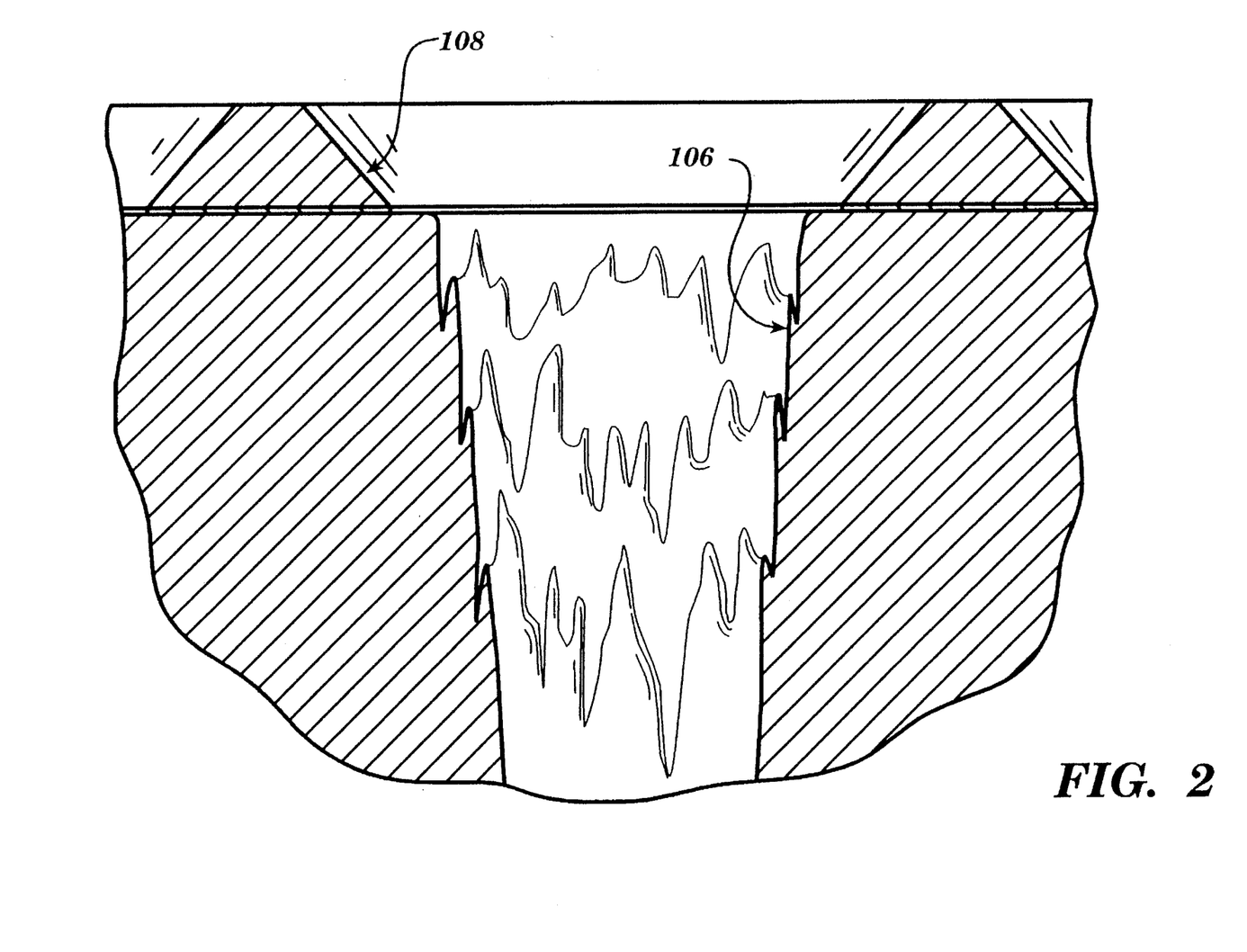
Figure 3:
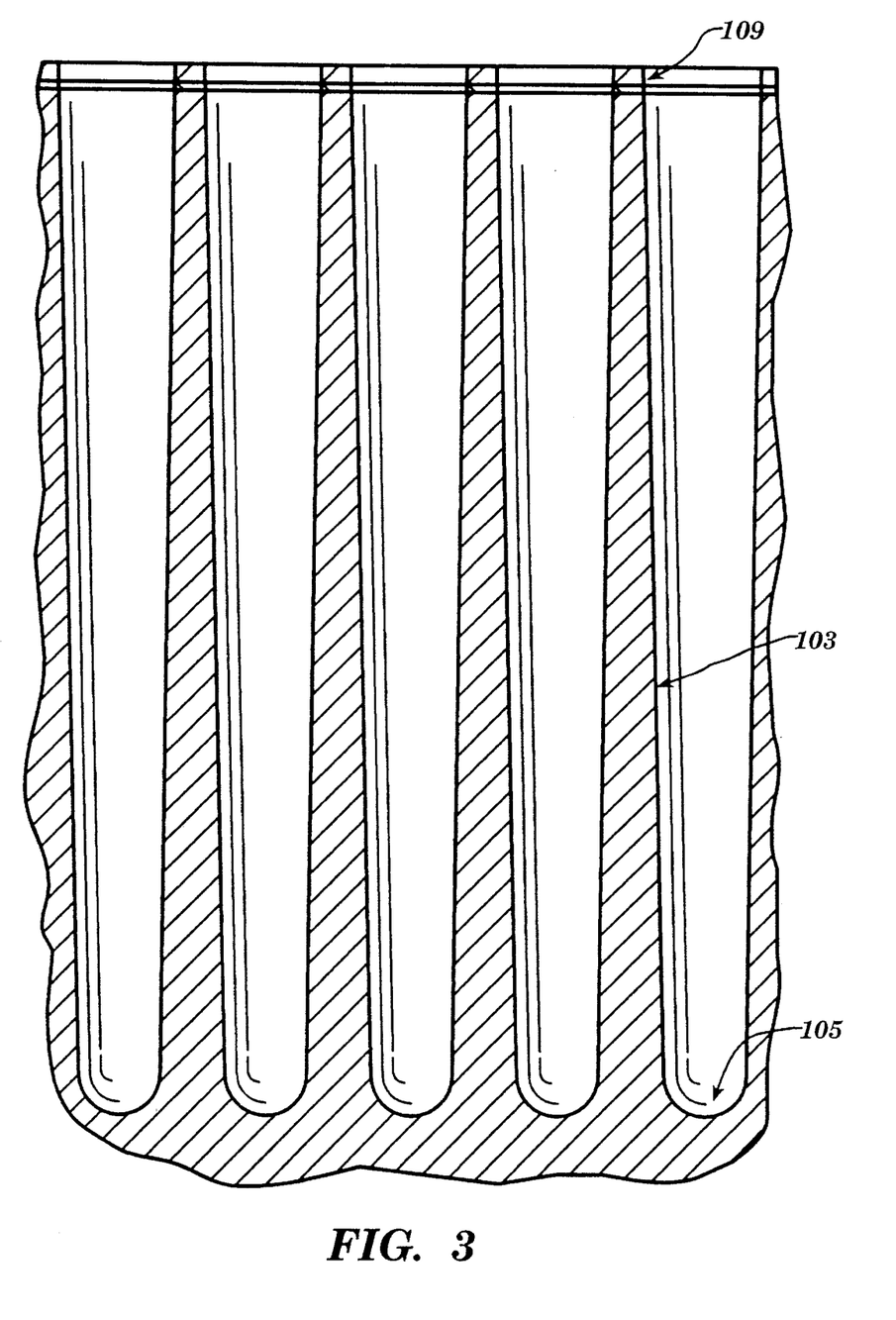
FIG. 3 is a cross section of the ideal product of a process for creating a deep trench.

Referring to FIGS. 1 and 2 (undesirable features) and 3 (ideal features), one can compare the result of an ideal process to problems observed in previous processes. One of the common problems encountered in cutting deep trenches is bowing of the walls (102). The sidewalls of the trenches must be regular in that they must have a uniform slope (103); the slope of the sidewalls should vary minimally as a function of depth. The sidewalls should have a constant, near-vertical slope. A dovetail trench bottom (104), wherein the bottom of the trench has a convex, hemispherical shape, is undesirable. A concave, rounded trench bottom (105) is desired in order to optimize trench filling and eliminate void formation in the filler. A dovetailed trench bottom is difficult to reliably cover with layers to be subsequently deposited within the trench. Another phenomenon that causes problems is "raking." Raking is the staggered and irregular erosion of the silicon crystal near the mouth of the trench (106) (FIG. 2). It is readily observed by scanning electron microscopy. A further common problem is tapering of the mask edges, which in the ideal case should have a vertical profile There is therefore a need for a process for creating deep, narrow, uniform trenches in a silicon substrate.

SUMMARY OF THE INVENTION

This need is satisfied, the limitations of the prior art overcome, and other benefits realized in accordance with the principles of the present invention which relates to a process for anisotropically etching a crystalline silicon substrate comprising:

(a) immobilizing a crystalline silicon substrate on an electrostatic chuck in a plasma etching apparatus having a cathode and an anode;

(b) heating the silicon substrate by raising the cathode temperature to 30° to 80° C.;

(c) exposing the silicon substrate to a plasma generated from bromine, fluorine and oxygen; and (d) carrying out a plasma etch with the temperature of the cathode held at 30° to 80° C.

Preferred sources of bromine, fluorine and oxygen are HBr, $NF_3$, and $O_2$, respectively. An effective plasma can be generated from a mixture of from 40 to 105 parts of HBr, 5 to 25 parts of $NF_3$ and 12 to 25 parts of a 30:70 mixture of oxygen and helium at a pressure of 20 to 150 mTorr. Preferably, the plasma is generated from a mixture of 60 to 70 parts of HBr, 8 to 14 parts of $NF_3$ and 17 to 21 parts of the oxygen helium mixture at a pressure of 90 to 110 mTorr. The preferred temperature range for the cathode is 50°–75° C. and the optimum about 65° C. The electrostatic chuck is preferably a monopolar chuck coated with polyimide.

DETAILED DESCRIPTION OF THE INVENTION

To understand the process of the invention, it is probably best to begin with an understanding of the typical commercial tool used to carry out reactive ion etching (RIE).

Figure 4:
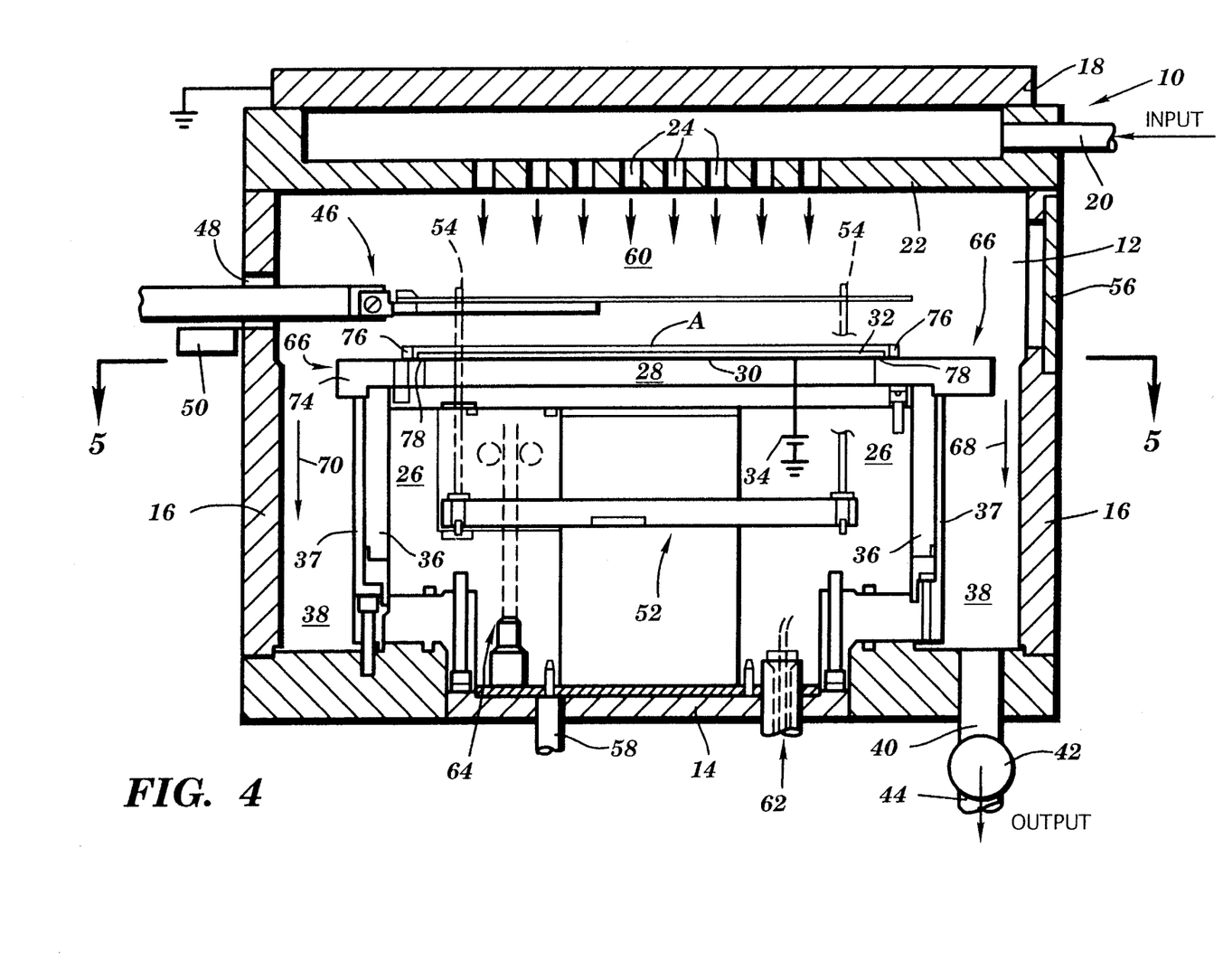
FIG. 4 is a sectional view of a gas flow system suitable for use in carrying out the process of the present invention.

Referring to FIG. 4 of the drawings, there is illustrated in a sectional view a plasma etching apparatus suitable for use in the process of the invention. The system X0 includes a chamber 12 having a base plate 14, a cylindrical sidewall 16 and a top lid 18. A processing or reactive gas input or inlet 20 having a manifold 22 with a plurality of apertures 24, centrally disposed with respect to the cylindrical sidewall 16 and extending laterally about 15 cm, is disposed between the sidewall 16 and the top lid 18 of the chamber 12. The number of apertures in the manifold may be varied, but, while useful in optimizing the gas distribution, the number and pattern do not appear to be critical to the success of the process of the invention. The chamber base plate 14, the sidewall 16, the top lid 18 and the manifold 20 are preferably made of aluminum and are connected to electrical ground. A cathode 26, also preferably made of aluminum, is disposed on but insulated from the base plate 14, and a pedestal 28, which preferably has an anodized surface, located on the cathode 26 supports an electrostatic chuck 30 which in turn supports a semiconductor wafer 32. The electrostatic chuck 30 includes laminated layers of polyimide, copper and polyimide (not shown). Typical electrostatic chucks are described in U.S. Pat. Nos. 4,384,918 and 5,350,479, the disclosures of which are incorporated herein by reference. The nickel shunt electrostatic chuck employed in the experiments described below has become commercially available from Applied Materials, Inc. subsequent to our work.

A positive voltage from a voltage source, such as a battery 34, is applied to the copper layer of the electrostatic chuck 30. A cylindrical quartz wall 36 surrounds the cathode 26. An anodized aluminum external cover 37 surrounding the quartz wall 36 defines a passageway 38 with the cylindrical sidewall 16 of the chamber 12 through which processing gases flow from the gas input 20 to a pump port 40 located on the right side of the chamber 12. A pump 42 discharges the processing gas from the pump port 40 to a processing gas output 44.

A wafer handler 46 carries the wafer 32 into and out of the chamber 12 through a slit 48 located in the sidewall 16 on the left side of the chamber 12. A hinged slit valve 50 is provided to close the chamber 12 when the wafer handler 46 is withdrawn. A wafer lift mechanism 52 is provided to transfer the wafer 32 from the wafer handler 46 to the electrostatic chuck 30 prior to processing and from the electrostatic chuck 30 to the wafer handler 46 after the processing is completed, with the wafer riding on the lift pins 54 of the wafer lift mechanism 52. Although only two lift pins 54 are indicated in FIG. 4, the wafer lift mechanism 52 is generally provided with four lift pins. The wafer lift mechanism 52 is driven by pneumatics (not shown). A quartz window 56 for viewing the interior of the chamber 12 is provided in the chamber sidewall 16 opposite the slit 48.

An R.F. system 58 is connected to the cathode 26 to produce a plasma region 60 between the pedestal 28 and the gas input 20. A heat transfer fluid (water) system indicated in part at 62 is provided for maintaining the temperature of the cathode 26 and a helium cooling system indicated in part at 64 is provided for cooling the wafer 32.

It should be understood that the system 10 described hereinabove is generally known and is of a standard type used in the semiconductor processing industry.

Figure 5:
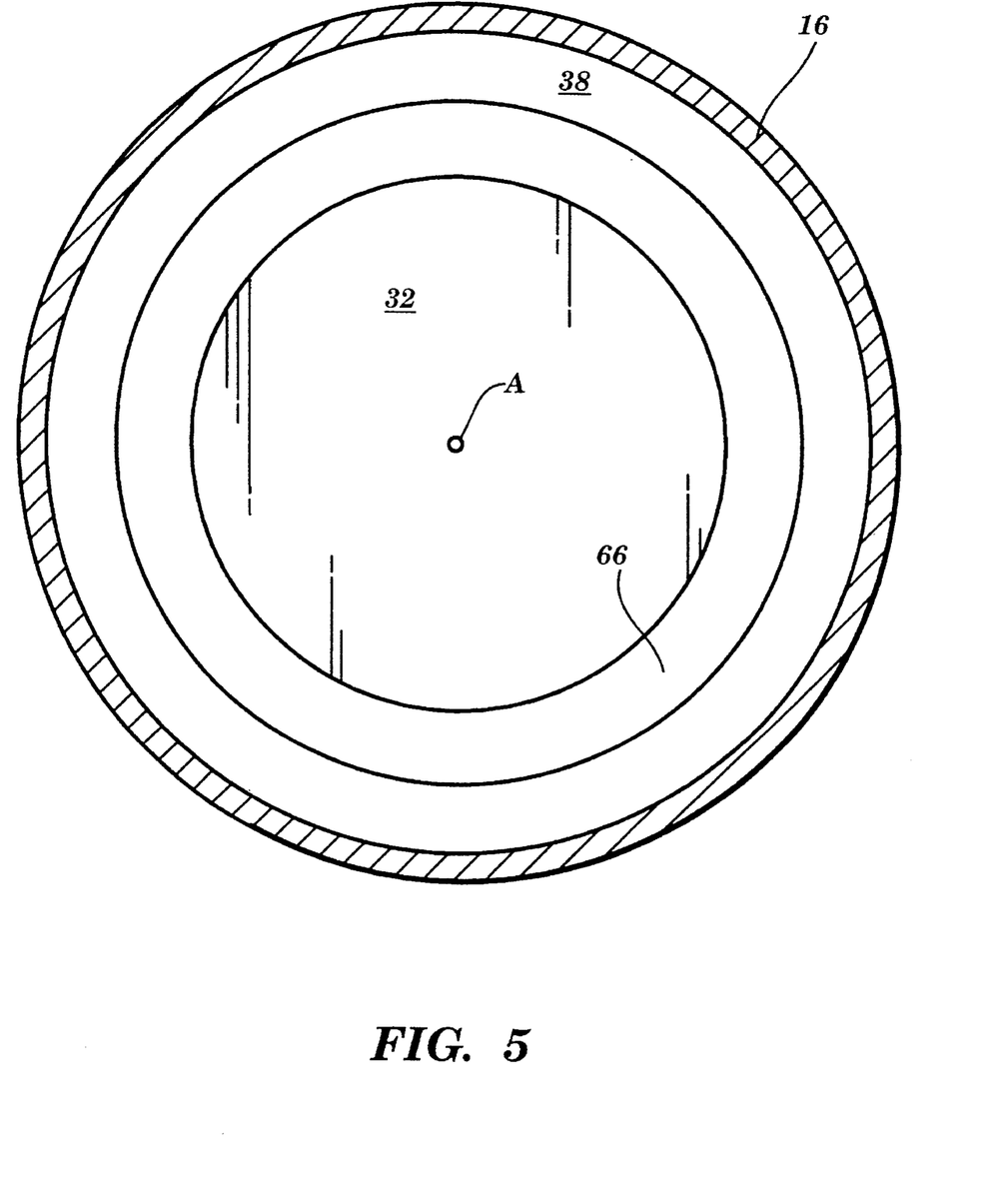
FIG. 5 is a top view of the gas flow system of FIG. 4 taken through section 5—5 thereof illustrating the relationship between a wafer contained in a chamber of the system and a collar surrounding the wafer, the chamber having a cylindrical interior wall.

A collar 66, preferably made of quartz, is provided to surround the electrostatic chuck 30 and the wafer 32, as seen more clearly in FIG. 5 of the drawings. Referring back to FIG. 4, it should be noted that without the use of the collar 66, the reactive gas (HBr/NF$_3$/O$_2$) flow would give rise to more rapid etching on the edge of the wafer.

As shown in FIG. 4, the collar 66 is provided with a base 78, which is set below wafer 32 during processing, and surrounds the bottom peripheral edge of wafer 32. Although base 78 is positioned adjacent to the bottom peripheral edge of wafer 32, base 78 does not actually touch that bottom peripheral edge because pedestal 28 actually supports wafer 32 above base 78. Semiconductor wafers are flat, generally circular discs; however, since they typically include a small straightedge for reference purposes, they are not perfectly circular. Base 78 is generally circular so that it surrounds the bottom peripheral edge of wafer 32.

To further enhance the uniformity of the etch rate, a focus ring 76 may be provided on the upper surface of the collar 66. Since the wafer handler 46 moves between the gas inlet 20 and the focus ring 76, the focus ring 76 cannot have a high profile without substantially increasing the size of the chamber 12. However, by forming the focus ring on the collar 66, a high profile focus ring need not be used to provide desired uniform etching results.

To better understand the relationships among the elements of the apparatus, reference may be had to FIG. 5 of the drawings which illustrates a top view of FIG. 4 taken through line 5—5 thereof wherein like reference characters refer to similar elements found in FIG. 4. As can be seen in FIGS. 4 and 5, the chamber sidewall 16 has a center through point A. Additionally, wafer 32 and base 78 both have their center point on the center line going through point A.

There are several problems that arise in utilizing the foregoing apparatus to create deep capacitor trenches. When the plasma is generated, the transfer of energy to the wafer results in a rapid temperature rise. If the temperature of the wafer is not somehow controlled, it would ultimately reach 200° to 300° C., which would result in complete process failure. For that reason, it is known in the art to cool the cathode and the chuck, and the common apparatus as provided by commercial vendors is supplied with a cooling system designed to keep the cathode at 18° or 20° C. However, even with cooling there is an approximately 30° C. gradient from the center to the edge of a 20 cm wafer during processing. As a result of this temperature inhomogeneity, it has been assumed in the art that it would be virtually impossible to create uniform trenches across the entire surface of the wafer. In particular, there is commonly loss of mask on the edge, because the temperature is hotter there; this is referred to as silicon encroachment. In addition, no matter how efficient the cooling, one observes narrower trenches in the center of the wafer than at the edge. Moreover, at various locations on the wafer, the tops of the trenches are raked and the bottoms are dovetailed and the sidewalls are off the vertical. Because of the non-uniformity of trenches from center to edge, the design rules for manufacture of wafers in standard equipment employ a "6 mm edge exclusion." This means that all devices created within 6 mm of the edge of the wafer are expected to fail to meet specification. Since the silicon encroachment and edge exclusion are the result of the 30° higher temperature of the edge, the standard approach in the art has been to search for ways to more efficiently and evenly cool the chuck or cathode.

Applicants have now surprisingly found that contrary to expectation and intuition, heating the cathode (and thereby the wafer) leads to less mask erosion, less dovetailing, more nearly vertical walls, and far better uniformity across the wafer. In particular, with the process disclosed herein, the edge exclusion can be halved.

By heating the cathode at about 65° C. and allowing the wafer to equilibrate at that temperature before initiating RIE, a significant improvement is observed. During RIE the cathode temperature is maintained at about 65°. As will be clear from the description of the apparatus above, the wafer is not thermally tightly coupled to the cathode, and its temperature may rise to 90° to 130° C. Commonly, it will stabilize at about 100° to 110° C., although this temperature will depend to some extent on the rate of helium flow and the mass of the wafer. With the cathode cooled to 18° or 20° C. as was common in the art, one could choose between having acceptable trenches near the edges of the wafer and unacceptable trenches in the center or vice versa. With the process of the invention, wherein the RIE is initiated at an elevated cathode temperature, so-called "sweet spots" are eliminated and virtually the entire wafer becomes useable.

The RIE is carried out with a mixture of gases that provide a source of bromine, fluorine and oxygen. The use of the particular mixture of HBr, NF$_3$ and oxygen diluted with helium in the process of the invention gives rise to very uniform anisotropic etching in which the sidewall angles are from 88 to 89.5 degrees, there is negligible mask erosion and raking at the top of the trench and the bottom of the trench presents a more uniform concave hemispheric profile. A photomicrograph of a series of trenches produced by the process of the invention resembles the idealized cross section of FIG. 3 quite closely. The use of the process of the invention results in a high throughput and very little down time. We have been able to produce 4.9 wafers per hour with a tool availability of 61%. This is much higher than any known process. The optimal parameters in the tool described above are as shown in the table below:

TABLE 1

| Parameters | Operable Range | Optimum Range | Preferred Values[1] |
|---|---|---|---|
| HBr (sccm) | 40–105 | 60–70 | 65 |
| NF$_3$ (sccm) | 5–25 | 8–14 | 11 |
| 70:30 He O$_2$ (sccm) | 12–25 | 17–21 | 19 |
| Pressure (mTorr) | 20–150 | 90–110 | 100 |
| Power (W) | 500–900 | 675–725 | 700 |
| B-Field (G) | 10–40 | 15–25 | 20 |
| Back Side He (Torr) | 6–10 | 10 | 10 |
| Cathode Temp (°C.) | 30–80 | 50–75 | 65 |

[1]For 200 mm wafer in AME 5000 Tool with polyimide monopolar electrostatic chuck The etch process of the present invention was carried out a <100> oriented silicon substrate. A 4000Å oxide layer then a 1700Å silicon nitride layer were disposed over a 140Å pad oxide on the top of the silicon substrate. The silicon oxide and silicon nitride layers form an etch mask for the reactive ion etch of the silicon substrate. During RIE, the oxygen reacts with the silicon as it is volatilized from the substrate to produce a "deposition oxide" which is laid down on the top of the 4000Å oxide layer originally present. By measuring the total oxide thickness at the end of the RIE at various points on the wafer, one can measure the uniformity of the process across the wafer. The ideal process combines a low variability of deposition oxide (1-$\sigma$) and a high etch rate (depth per unit time).

Etches were carried out under the conditions described in Table 2, where experiment 1 is given as a control cell for the purpose of reference. In all cases shown, the backside helium pressure was 8 Torr, the chamber pressure was 100 mTorr, the Rf power was 700 W and the B-field was 20 Gauss. In examples 1–3 a 5-hole manifold was used; in example 4, a 24-hole manifold was used. The temperatures are in degrees Celsius; the reactant gas flows are is SCCM and the times are in seconds.

TABLE 2

| | Process Parameters | | | | | |
|---|---|---|---|---|---|---|
| Expt | Cathode Temp | Wall Temp | HBr | NF$_3$ | HeO$_2$ | Time |
| 1 | 18 | 45 | 65 | 12 | 19 | 1050 |
| 2 | 36 | 65 | 65 | 12 | 19 | 1050 |
| 3 | 65 | 65 | 65 | 12 | 19 | 1050 |
| 4 | 58 | 40 | 65 | 9 | 20 | 900 |

The results of the etch process for each of the examples above are presented in the Tables 3–5.

TABLE 3

| | Etch Rate and Uniformity | | | | | | | |
|---|---|---|---|---|---|---|---|---|
| | Oxide Uniformity | Trench depth in µm at 6 wafer sites | | | | | | |
| Example | 1-$\sigma$ | Ctr | BL-6 | TR-3 | TL-3 | Br-3 | BL-3 | Avg. |
| 1 | 12.6 | 8.9 | 9.4 | 10.30 | 10.20 | 9.6 | 9.50 | 9.7 |
| 2 | 13.4 | 9.1 | 9.3 | 10.10 | 10.30 | 10.30 | 9.50 | 9.8 |
| 3 | 10.1 | 9.7 | 10.30 | 10.40 | 10.30 | 10.80 | 10.30 | 10.3 |
| 4 | N/A | 6.9 | 8.7 | 9.0 | 9.3 | N/A | 9.3 | 4.6 |

The high uniformity (low 1-$\pi$ value) coupled with high etch rate (higher average depth) of example 3 is particularly noteworthy. The six wafer sites represented in the table are: (1) Ctr=center of wafer; (2) BL-6=between 180° and 270 °6 mm from the edge; (3) TR-3=between 0° and 90°3 mm from the edge; (4) TL-3=between 90° and 180° 3 mm from the edge; (5) BR-3=between 270° and 360° 3 mm from the edge; and (6) BL-3=between 180° and 270° 3 mm from the edge. The locations are given in Cartesian coordinates (0° is right side, 90° is top).

TABLE 4

| | Sidewall Uniformity | | | | | |
|---|---|---|---|---|---|---|
| | Ctr | | BL-6 | | TR-3 | |
| Example | top∠ | mid∠ | top ∠ | mid∠ | top∠ | mid∠ |
| 1 | 84.3 | 88.3 | 87.1 | 88.9 | 87.1 | 89.1 |
| 2 | 84.3 | 88.6 | 87.1 | 89.4 | 88.6 | 89.1 |
| 3 | 88.6 | 88.9 | 87.1 | 89.4 | 88.6 | 89.4 |
| 4 | 87.1 | 87.7 | 87.9 | 89.3 | 90.0 | 89.4 |

The data in Table 4 are obtained by measuring the width of the trench at the surface of the silicon (0 µm), at 1 µm depth and at 6 µm depth. The top angle is the angle between the top surface of the silicon and a sidewall defined by the 0 µm and 1 µm measurements; the mid angle is the angle between the top surface of the silicon and a sidewall defined by the 1 µm and 6 µm measurements. In the ideal case both would be the same. In examples 1 and 2, the top angle varied significantly from center to edge of the wafer; in example 4, although top angle uniformity is improved, it is outside the desired process boundaries for some purposes. Example 3 shows better process performance; the across-wafer uniformity and closeness to the 88–89.5° specification are noteworthy. In example 1, a chip in the lower right quadrant of the wafer was found to exhibit trenches whose central axis was tilted 1° from the vertical; in examples 2 and 3 all trenches examined were vertically aligned; no data were available for example 4.

TABLE 5

| | Mask and Surface Character | | |
|---|---|---|---|
| Example | Faceting | Erosion | Morphology |
| 1 | TR,TL,BL | No | Acceptable |
| 2 | TR,TL,BR | No | Acceptable |
| 3 | TL | No | Acceptable |
| 4 | TL,BR | No | Borderline |

Faceting, as indicated in Table 5, refers to a beveled or sloping edge on the mask on chips in the quadrants listed (TR=0°–90°, BR=270°–360°, BL=180°–270° and TL=90°–180°); the profile should be vertical. Erosion of the mask, i.e. thinning of the mask over the surface of the silicon, was not observed in any of the examples shown in Table 5. Morphology refers to whether or not raking, dovetails and other undesirable characteristics were observed. Once again example 3 is optimal.

It is clear from the data in Tables 3–5 that the process of the invention virtually eliminates most of the recognized problems.

While the invention has been particularly shown and described with reference to preferred embodiments thereof, it will be understood by those skilled in the art that other changes in form and details may be made therein without departing from the spirit and scope of the invention.

We claim:

1. A process for anisotropically etching a crystalline silicon substrate comprising:
   (a) immobilizing a crystalline silicon substrate on an electrostatic chuck in a plasma etching apparatus having a cathode and an anode;
   (b) heating said silicon substrate by raising the cathode temperature to 30° to 80° C.;
   (c) exposing said silicon substrate to a plasma generated from a mixture of gases comprising sources of bromine, fluorine and oxygen; and
   (d) carrying out a plasma etch with the temperature of the cathode held at 30° to 80° C.

2. A process according to claim 1 wherein said plasma is generated from a mixture comprising HBr, $NF_3$, and $O_2$.

3. A process according to claim 2 wherein said plasma is generated from a mixture of from 40 to 105 parts of HBr, 5 to 25 parts of $NF_3$ and 12 to 25 parts of a 30:70 mixture of $O_2$ and He at a pressure of 20 to 150 mTorr.

4. A process according to claim 3 wherein said plasma is generated from a mixture of from 60 to 70 parts of HBr, 8 to 14 parts of $NF_3$ and 17 to 21 parts of a 30:70 mixture of $O_2$ and He at a pressure of 90 to 110 mTorr.

5. A process according to claim 1 wherein said cathode temperature is from 50° to 75° C.

6. A process according to claim 4 wherein said cathode temperature is about 65° C.

7. A process according to claim 1 wherein said electrostatic chuck is a monopolar chuck coated with polyimide.

* * * * *

UNITED STATES PATENT AND TRADEMARK OFFICE
CERTIFICATE OF CORRECTION

PATENT NO. : 5,605,603
DATED : February 25, 1997
INVENTOR(S) : Grimard et al.

It is certified that error appears in the above-indentified patent and that said Letters Patent is hereby corrected as shown below:

Column 5, line 66, delete "(low 1-$\pi$ value)" and insert therefor --(low 1-$\sigma$ value)--.

Signed and Sealed this

Third Day of June, 1997

Attest:

BRUCE LEHMAN

*Attesting Officer*  *Commissioner of Patents and Trademarks*